United States Patent [19]

Spence et al.

[11] 3,916,332

[45] Oct. 28, 1975

[54] RADIATION TOLERANT BUFFER AMPLIFIER

[75] Inventors: Hilton W. Spence; Robert A. Stehlin, both of Richardson, Tex.

[73] Assignee: Texax Instruments Incorporated, Dallas, Tex.

[22] Filed: Nov. 8, 1971

[21] Appl. No.: 196,278

Related U.S. Application Data

[63] Continuation of Ser. No. 882,659, Dec. 5, 1969, abandoned.

[52] U.S. Cl. .................... 330/33; 307/308; 330/22; 330/30 D

[51] Int. Cl. ............................................ H03f 3/08

[58] Field of Search ......... 330/18, 22, 23, 30 D, 69, 330/33; 307/242, 241, 308; 328/95

[56] References Cited

UNITED STATES PATENTS

| | | | |
|---|---|---|---|
| 3,290,563 | 12/1966 | Hyer et al. | 330/51 X |
| 3,333,113 | 7/1967 | Cole et al. | 307/241 X |
| 3,436,672 | 4/1969 | Delagrange | 330/18 X |
| 3,541,466 | 11/1970 | Yee | 307/241 X |
| 3,654,494 | 4/1972 | Bartlett et al. | 330/30 D X |
| 3,671,770 | 6/1972 | Fredriksen | 330/22 X |

*Primary Examiner*—Rudolph V. Rolinec
*Assistant Examiner*—Lawrence J. Dahl
*Attorney, Agent, or Firm*—Harold Levine; James T. Comfort; James O. Dixon

[57] ABSTRACT

A radiation tolerant differential buffer amplifier provides amplification to small amplitude input signals. Circuitry is provided to selectively gate portions of the input signals for reduction of noise problems. Biasing circuitry sets a constant DC bias level for the amplifier to accomplish generally constant triggering of the amplifier.

8 Claims, 8 Drawing Figures

RADIATION TOLERANT BUFFER AMPLIFIER

This is a continuation, of application Ser. No. 822,659, filed Dec. 5, 1969 now abandoned.

This invention relates to amplifiers, and more particularly to radiation tolerant differential amplifiers having generally constant triggering levels.

It is often necessary in a number of different applications to amplify selected portions of extremely low level signals. As an example, amplification systems are required to sense the outputs of plated wire memories wherein magnetic film is disposed on plated wires which are intersected with insulated wires connected to form word coils. Bits of information may thus be stored at each intersection of an insulated word coil with a plated wire, the binary value of the information bit being represented by the direction of the magnetic vector. Exemplary plated wire memories are manufactured and sold by the Librascope Group, a subsidiary of General Precision Equipment Corporation. The voltage outputs from such plated wire memories are relatively low, in the range of about 5–20 millivolts, and thus substantial amplification problems are created thereby. These problems are even more exaggerated wherein it is desired to determine whether or not the low level signals are positive or negative, and then to amplify selected portions of the signals up to a level of three to four volts.

It is generally well known that reverse biased semiconductor junctions generate additional leakage current when bombarded by radiation, and in particular gamma and neutron radiation. This radiation dislodges hole-electron pairs which act like current flow. This phenomena is particularly troublesome with semiconductor transistors used as amplifier circuits, as the gamma radiation causes additional current flow which tends to saturate the amplifying transistors beyond the point of amplification. It is thus an object of the present invention to provide amplification circuitry which is generally insensitive to high magnitude fields of radiation.

In accordance with the present invention, a differential amplifier system includes first and second input terminals which receive small amplitude input signals. A differential amplifier is connected to the input terminals, with gate means being connected to each of the input terminals for selectively blocking the transmission of the input signals to the amplifier. A strobe circuit is connected to the output of the amplifier for selectively gating portions of the amplified output signal from the amplifier.

In accordance with another aspect of the invention, an electronic amplifier is provided with bias voltage through an active electronic device. A first unidirectionally conducting device is connected at one terminal to the control electrode of the active electronic device. A second unidirectionally conducting device is connected between the other terminal of the first unidirectionally conducting device, the first and second unidirectionally conducting devices being connected at like terminals to provide a generally temperature insensitive bias voltage to the amplifier.

In accordance with yet another aspect of the invention, circuitry having generally constant operating characteristics in the presence of neutron radiation is connected between an electronic amplifier and a bias terminal for receiving bias voltage. First and second unidirectionally conducting devices having like terminals connected are disposed across the circuitry to provide a generally constant current through the circuitry.

In accordance with a more specific aspect of the invention, a first transistor is connected between a first source of bias voltage and an amplifier. A first diode is connected between the base of the first transistor and ground to provide a generally constant emitter bias signal for application to the amplifier. A second transistor is connected between the amplifier and a second source of bias voltage of opposite polarity than the first source of voltage. A third transistor is connected across the electrodes of the second transistor to provide generally constant operating characteristics in the presence of neutron radiation. A second diode is connected across the third transistor to provide a generally constant current to the amplifier.

For a more complete understanding of the present invention and for further objects and advantages thereof, reference is now made to the following description taken in conjunction with the accompanying drawings, in which.

Figure 7:
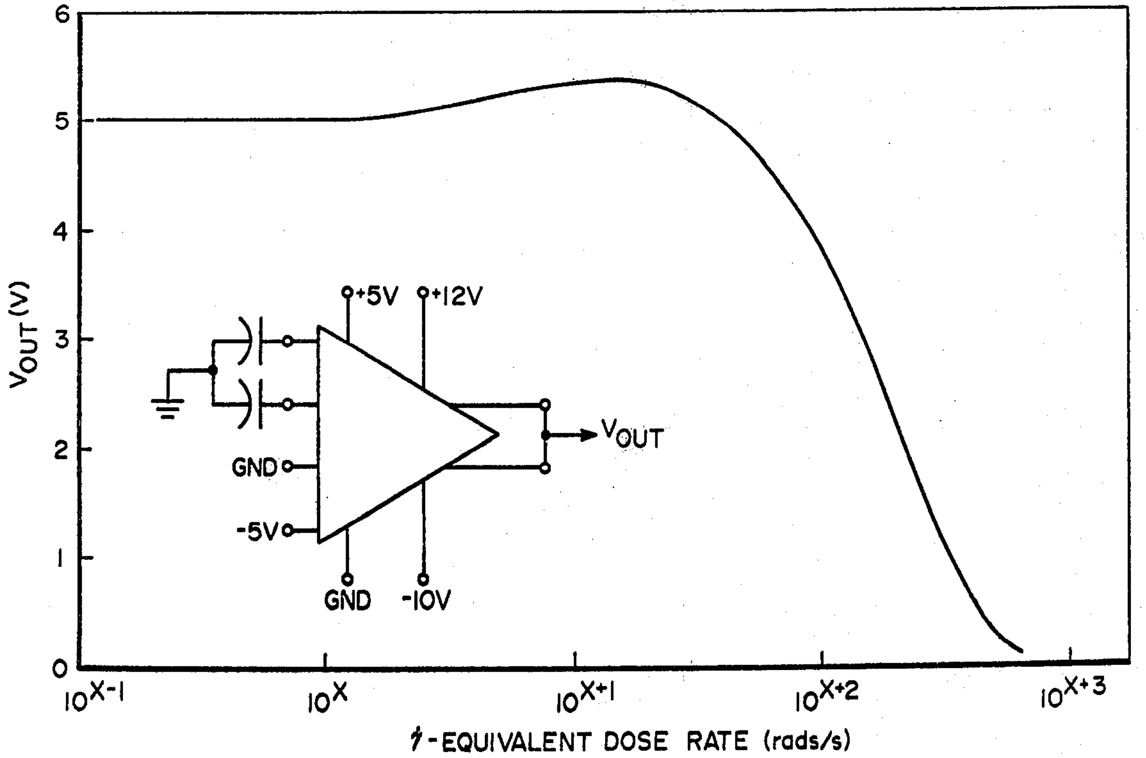
Figure 2:
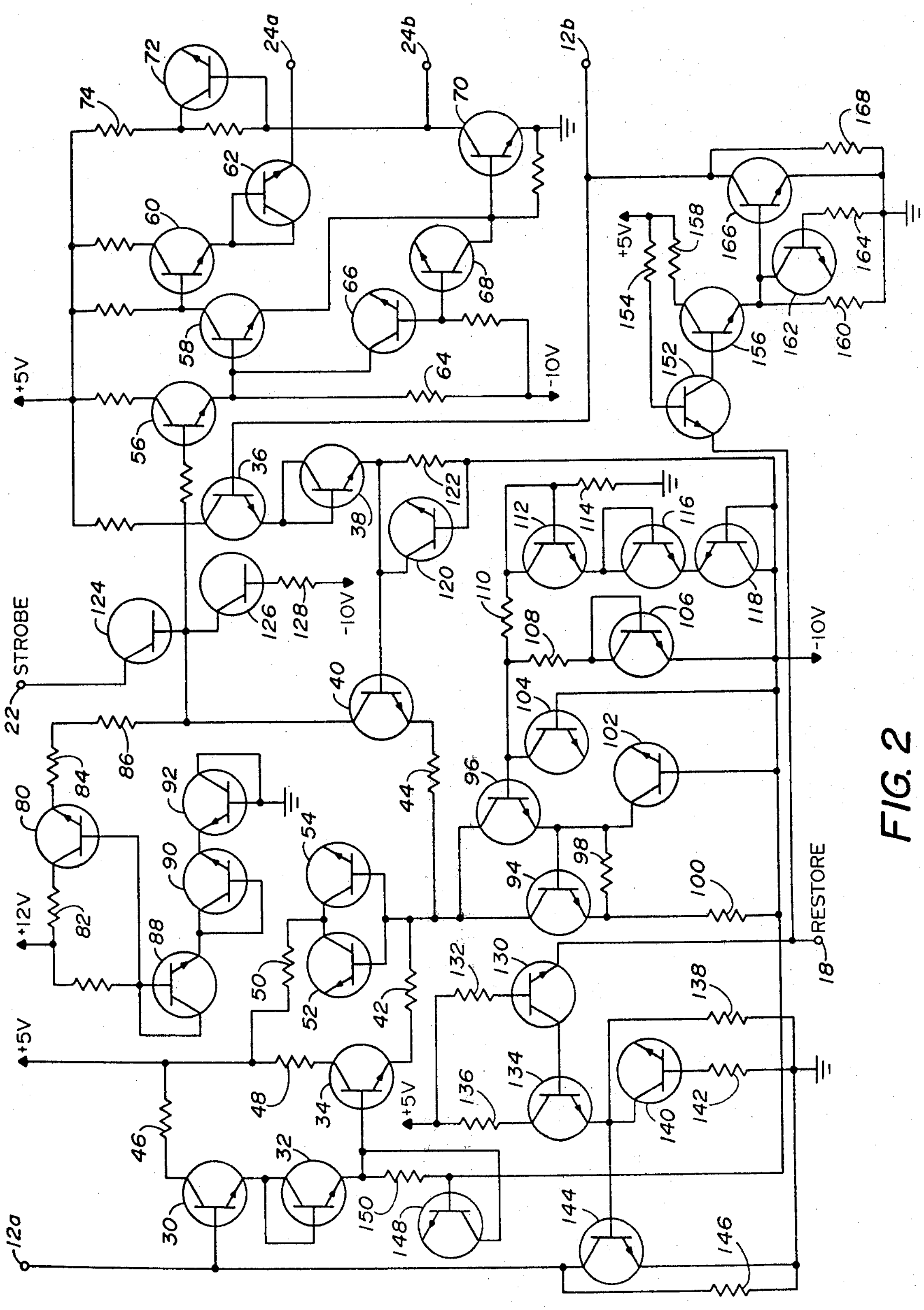
FIG. 2 is a schematic diagram of the preferred embodiment of the circuit of FIG. 1.
Figure 8:
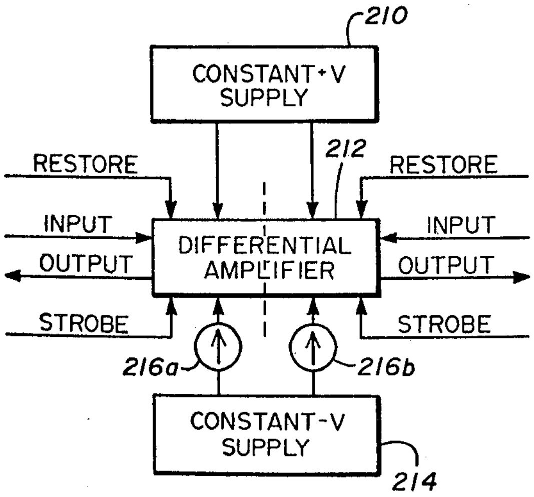

FIGS. 6*a–d* are graphical representations of waveforms of the circuit of FIG. 2;

FIG. 7 is a graph illustrating the operation of the circuit shown in FIG. 2 in the presence of a radiation field; and FIG. 8 is a block diagram of another embodiment of the invention.

Figures 1, 3:
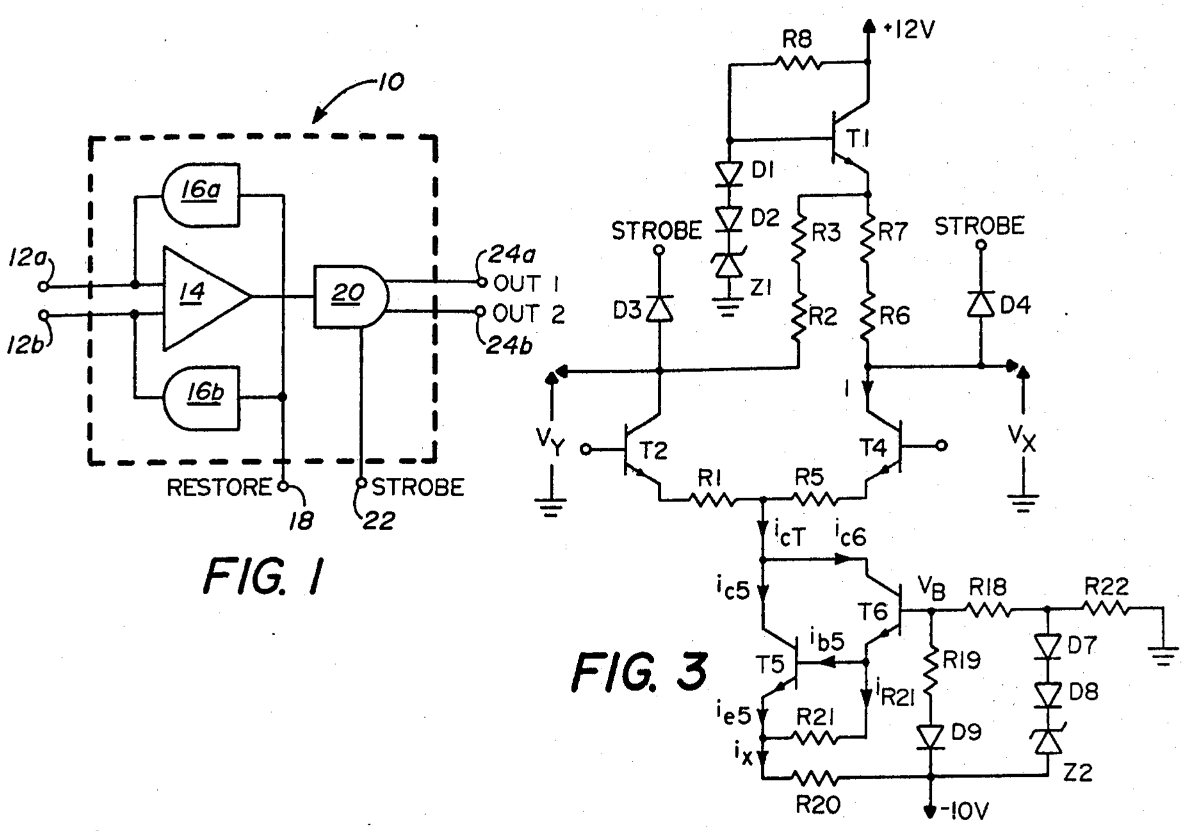
FIG. 1 is a block diagram of a typical circuit utilizing the present amplification invention.
FIG. 3 is a circuit diagram of another embodiment of the invention.

Referring to FIG. 1, the present amplification system is illustrated generally by the numeral 10. A pair of relatively low level input signals are applied through input terminals 12*a–b* to the input of a differential amplifier 14. A pair of NAND gates 16*a–b* are controlled by the application of Restore Signals to the terminal 18 for control of the input signals fed to amplifier 14. The amplified output from amplifier 14 is fed through a NAND gate 20, the operation of which is controlled by a Strobe Signal applied to terminal 22. Amplified output signals appear upon output terminals 24*a–b*. The present circuit is particularly useful in acting as a gated buffer amplifier for a sensing amplifier system which senses plated wire memories. An exemplary switched preamplifier circuit for use with plated wire circuits is disclosed in applicants' copending patent application Ser. No. 888,393, filed Dec. 29, 1969.

The present circuit is particularly useful for use with plated wire memories when it is desired to amplify only a selected portion of the generally sinusoidal wave output of the memories. The Restore Signals are applied just prior to the occurrence of the amplified plated wire output signal to eliminate noise problems. If it is desired to detect the occurrence only of a positive portion of the memory output, a Strobe logic one signal is applied at the terminal 22 only during the time of the expected positive portion of the signal.

FIG. 2 illustrates in schematic detail the present amplification system. Input signals are applied at terminals 12*a–b*. Input signals applied to terminal 12*a* are applied to the base of a transistor 30, the emitter of which is connected to the commonly tied collector and base of a transistor 32. Transistor 32 thus acts as a diode to shift the level of the input signal by one $V_{BE}$. The emitter of transistor 32 is connected to the base of the transistor 34 which serves as part of a differential amplifier stage. Input signals fed to terminal 12*b* are applied to the base of a transistor 36, the emitter of which is connected to the commonly tied collector and base of a transistor 38. Transistor 38 also shifts the level of the input signals to the desired level.

The emitter of transistor 38 is fed to the base of a transistor 40 which serves as the remaining half of the differential amplifier stage of the invention. The emitters of transistors 34 and 40 are commonly tied together through resistors 42 and 44. Positive bias voltage is applied to transistor 30 via resistor 46 and to transistor 34 via resistor 48. A resistor 50 is connected to the source of positive voltage and to the commonly tied collectors of transistors 52 and 54. The bases of transistors 52 and 54 are connected to the juncture point of resistors 42 and 44.

The output of the differential amplifier is fed from the collector of transistor 40 to the base of the transistor 56. Transistor 56 is connected in an emitter follower configuration with transistor 58 to act as a buffer stage for the output of the amplifier. The collector of transistor 58 is fed to the base of a transistor 60, the emitter of which is connected to the commonly tied collector and base of a diode connected transistor 62. The emitter of transistor 62 is connected to the output terminal 24*a*. The emitter of transistor 56 is connected to a source of negative bias potential through a resistor 64. A transistor 66 is connected in a diode configuration across resistance 64. Transistor 66 is connected in series with a diode connected transistor 68 which is connected to the emitter of transistor 58. The emitter of transistor 58 is connected to the base of a transistor 70, the collector of which is connected to the output terminal 24*b*. The collector of transistor 70 is connected to the base of a diode connected transistor 72 which is connected through a resistance 74 to a source of positive bias potential.

As previously noted, it is important to set the voltage at the collector of transistor 40 at a stable DC level to enable constant triggering of the present device. The biasing circuitry for accomplishing this function includes a transistor 80 connected at its collector through resistance 82 to a source of positive voltage potential. The emitter of transistor 80 is connected through resistors 84 and 86 to the collector of transistor 40. The base of transistor 80 is connected to the commonly connected base and collector of a transistor 88. The emitter of transistor 88 is connected to the commonly tied collector and base of a transistor 90, the emitter of which is connected to the emitter of transistor 92. The base and collector of transistor 92 are commonly tied to circuit ground. As will be later described in detail, transistors 88, 90 and 92 serve as diodes across the base of transistor 80 to provide temperature and voltage operating condition stability.

Additional biasing circuitry includes a modified Darlington configuration comprising the transistor 94 connected at its collector to the juncture point of resistors 42 and 44. A transistor 96 is connected at its emitter to the base of transistor 94. The collectors of transistor 94 and 96 are commonly connected. A resistor 98 is connected across the emitters of transistors 94 and 96. A resistor 100 is connected between the emitter of transistor 94 and a source of negative voltage. The collector of transistor 102 is connected between the base of transistor 94 and a source of negative voltage. Likewise, the collector of a transistor 104 is connected to the base of transistor 96, with the base of transistor 104 being connected to the source of negative voltage potential. The emitters of transistors 102 and 104 are left unconnected in order to act as diodes.

The commonly tied collector and base of a transistor 106 is connected through a resistance 108 to the base of transistor 96. The emitter of transistor 106 is directly coupled to a supply of negative voltage. A resistance 110 is connected between the base of transistor 96 and the commonly tied base and collector of a transistor 112. The base of transistor 112 is connected through a resistance 114 to circuit ground. The emitter of transistor 112 is directly coupled to both the base and collector of a transistor 116. The emitter of transistor 116 is connected to the emitter of a transistor 118. Both the collector and base of transistor 118 are connected to the source of negative voltage. The transistors 112, 116 and 118 are connected to act as diodes in combination with the modified Darlington stage to provide temperature insensitive voltage level at the collector of transistor 40, as will be described in detail later.

The base of a transistor 120 is connected to the source of negative voltage. The collector of transistor 120 is connected to the base of transistor 40, while the emitter of the transistor 120 is left unconnected to provide diode action. A resistor 122 is connected across the base and collector of transistor 120.

The Strobe Signals are applied at terminal 22 and are fed to the collector of a transistor 124 connected in a diode configuration. The base of transistor 124 is tied to the collector of transistor 40. The collector of a transistor 126 is likewise connected to the collector of the transistor 40 in order to provide radiation compensation. The base of transistor 126 is fed through resistance 128 to a source of negative voltage.

Restore Signals are applied to terminal 18 and are fed to the emitter of a transistor 130. The base of transistor 130 is connected through a resistor 132 to a source of positive voltage. The collector of transistor 130 is connected to the base of the transistor 134, the collector of which is connected through resistance 136 to the source of positive voltage. The emitter of transistor 134 is connected to circuit ground through resistance 138 and is also connected to the collector of a diode connected transistor 140. The base of transistor 140 is also connected to circuit ground through the resistance 142. The emitter of transistor 134 is also tied to the base of a transistor 144, the emitter of which is directly coupled to circuit ground. A resistance 146 shunts the emitter and collector of transistor 144. The collector of transistor 144 is directly coupled to a base of input transistor 30. A transistor 148 is connected in a diode configuration to one terminal of a resistance 150, which is connected to the emitter of transistor 32. The collector of transistor 148 is directly coupled to the emitter of transistor 32.

The Restore Signal is also fed from terminal 18 to the emitter of a transistor 152. The base of transistor 152 is connected through a resistance 154 to a source of positive voltage. The collector of transistor 152 is connected to the base of a transistor 156, the collector of which is connected to the source of positive voltage through the resistance 158. The emitter of transistor 156 is connected through resistance 160 to circuit ground and also to the collector of a diode connected transistor 162. The base of transistor 162 is connected through resistance 164 to circuit ground. The emitter of transistor 156 is also connected to the base of a transistor 166, the emitter of which is directly coupled to ground. A resistance 168 shunts the collector and emitter of transistor 166. The collector of transistor 166 is directly coupled to the input terminal 12*b*.

As previously mentioned, it is extremely important to maintain the DC voltage at the collector of transistor 40 constant so that constant triggering of the circuit can be accomplished. FIG. 3 illustrates the biasing circuitry of the invention which maintains the constant DC level of the collector of the amplification stage at the preset value. FIG. 3 is similar to portions of FIG. 2, with the exception that an additional output $V_y$ is provided from transistor T2 which corresponds with transistor 34 in FIG. 2. Also an additional Strobe control terminal has been added to illustrate that selective Strobe control may, in some instances, be used to control either or both outputs of a differential circuit constructed in accordance with the invention. The identifying nomenclature applied to the circuit has been changed from that of FIG. 2, but it will be understood that T1 represents transistor 80 and T4 represents transistor 40. Diodes D1, D2 and Z1 represent the transistors 88, 90 and 92 which are connected in diode configuration. Transistors T5 and T6 will be seen to represent transistors 94 and 96. Diodes D7, D8, Z2 and D9 are representative of transistors 112, 116, 118 and 106 shown in FIG. 2. Resistors R1, R2 and R3 and diode D3 are not shown in FIG. 2.

The emitter of transistor T1 shown in FIG. 3 is not sensitive to variations in the positive voltage supply due to the presence of the Zener diode Z1. Further, diodes D1 and Z1 compensate each other so that total net voltage change across the base of transistor T1 caused by temperature variations is essentially zero. The diodes D7, D8, Z2 and D9 set generally constant voltage $V_B$ across the base of the transistor T6. This voltage $V_B$ is generally insensitive to changes in temperature and in the power supply output. The generally constant voltage $V_B$ provides an essentially constant current $i_x$ across resistor R20. However, the current $I_{cT}$ must be maintained generally insensitive to the presence of radiation fields, and in particular, insensitive to neutron radiation. The modified Darlington circuit comprising transistors T5 and T6 provides a generally constant $I_{cT}$, as the Darlington circuit is insensitive to the presence of neutron radiation. The resistor R21 allows the transistor T6 to operate at a slightly higher current value which has been found necessary in a gamma environment.

Utilizing the nomenclature of FIG. 3, the operation of the present biasing circuitry may be better understood by reference to the following equations. It may be shown that:

$$V_x = V_{Z1} + V_{D2} + V_{D1} - V_{BET1} - I(R6+R7) \qquad (1)$$

Considering the modified Darlington configuration shown in FIG. 3, the relationship of the current I may be developed:

$$i_{c5} = \alpha_5 i_{e5} \qquad (2)$$

$$i_{b5} = I_{e5} - i_{c5} = i_{e5}(1-\alpha_5) \qquad (3)$$

$$i_{c6} = \alpha_6 i_{e6} \qquad (4)$$

$$i_{e6} = i_{b5} + i_{R21} \qquad (5)$$

$$i_{c6} = \alpha_6(i_{b5} + i_{R21}) = \alpha_6[i_{e5}(1-\alpha_5) + i_{R21}] \qquad (6)$$

$$i_{cT} = i_{c5} + i_{c6} = \alpha_5 i_{e5} + \alpha_6(1-\alpha_5)i_{e5} + \alpha_6 i_{R21} = i_{e5}(\alpha_5+\alpha_6-\alpha_5\alpha_6)+\alpha_6 i_{R21} \qquad (7)$$

$$i_x = i_{e5} + i_{R21} \qquad (8)$$

$$i_{cT} = (i_x - I_{R21})(\alpha_5+\alpha_6-\alpha_5\alpha_6)+\alpha_6 i_{R21} = i_x(\alpha_5+\alpha_6-\alpha_5\alpha_6) - i_{R21}(\alpha_5+\alpha_6-\alpha_5\alpha_6-\alpha_6) \qquad (9)$$

For a reasonable value of $\alpha$, equation (9) may be rewritten as:

$$i_{cT} \approx i_x - K i_{R21} \qquad (10)$$

where $$K = (\alpha - \alpha^2)$$

Utilizing the nomenclatures of FIG. 3:

$$I_{cT} = I_{R20} - K\,I_{R21} \qquad (11)$$

$$I = \frac{\alpha I_c T}{2} \qquad (12)$$

$$I = \frac{\alpha}{2}(I_{R20} - K\,I_{R21}) \qquad (13)$$

$$I_{R20} = \frac{V_B - V_{BET5} - V_{BET6}}{R20} \qquad (14)$$

$$R_{R21} = \frac{V_{BET5}}{R21} \qquad (15)$$

$$I = \frac{\alpha}{2}\left[\left(\frac{V_B - V_{BET5} - V_{BET6}}{R20}\right) - \left(\frac{K\,V_{BET5}}{R21}\right)\right] \qquad (16)$$

The voltage, $V_B$, can be written as $$V_B = B\,V_{Z2} + V_D(1 + B) \qquad (17)$$

where $$B = \frac{R19}{R18 + R19}$$

and the assumption $$V_{D8} = V_{D7} = V_{D9} = V_D$$

was made.

$$I = \frac{\alpha}{2}\left\{\left[\frac{BV_{Z2} + V_D(1+B) - V_{BET5} - V_{BET6}}{R20}\right] - \left(\frac{K\,V_{BET5}}{R21}\right)\right\} \qquad (18)$$

Assume $$V_{BET5} = V_{BET6} = V_D$$

$$I = \frac{\alpha}{2}\left[\left(\frac{BV_{Z2} - V_D + BV_D}{R20}\right) - \frac{K\,V_D}{R21}\right] \qquad (19)$$

Substituting Equation (19) into Equation (1) gives $$V_x = V_{Z1} + V_{D2} + V_{D1} - V_{BET1} - \frac{\alpha(R6+R7)}{2}\left\{\left[\frac{B\,V_{Z2} - V_D(1-B)}{R20}\right] - \left[\frac{K\,V_D}{R21}\right]\right\} \qquad (20)$$

Further, assume $$V_{D1} = V_{D2} = V_{BET1} = V_D$$

and $$V_{Z1} = V_{Z2} = V_Z$$

$$V_x = V_Z + V_D - \frac{\alpha(R6+R7)}{2}\left\{\left[\frac{B\,V_Z - V_D(1-B)}{R20}\right] - \left(\frac{K\,V_D}{R21}\right)\right\} \quad (21)$$

Let $$A = \frac{\alpha(R6+R7)}{2R20}$$

and $$A' = \frac{\alpha(R6+R7)}{2R21}$$

$$V_x = V_Z(1-AB)+V_D(1+A-AB+A') \quad (22)$$

Thus, it may be seen that the voltage $V_x$ and $V_y$ are dependent only upon the voltage across the Zener diodes, the ratio of the various resistors utilized and the voltage drops across the transistors. Each of these values may be very accurately determined with conventional integrated circuit construction techniques.

It is also important that the voltages $V_x$ and $V_y$ be generally insensitive to temperature variations. Assuming that it would be desirable to have the voltage $V_x$ to track at −6mv/°C:

$$\frac{\delta V_x}{\delta T} = -6mv/o_C \quad (23)$$

$$\frac{\delta V_x}{\delta T} = \frac{\delta V_z}{\delta T}(1-AB) + \frac{\delta V_D}{\delta T}(1+A+A'-AB) \quad (24)$$

$$\frac{\delta V_z}{\delta T} = \frac{-\delta V_D}{\delta T} \approx 2\ mV/o_C \quad (25)$$

$$-6 = 2(1-AB) - 2(1+A+A'-AB) \quad (26)$$

$$3 = A + A' \quad (27)$$

It is important to determine optimum values of the resistor ratios as defined as A and B in the above Equations. For circuit reasons, it will be assumed that:

R6 = 2.5K
R7 = 0.85K
R21 = 1.5K

Therefore, $$A' = \frac{\alpha(R6+R7)}{2R21}K \quad (28)$$

$$A' = 0.022 \quad (29)$$

since, $$A = 3 - A'$$

$$A = 2.978 \quad (30)$$

Referring back to Equation (22), setting $V_x = 0$, and utilizing $V_Z = 6.2$ volts and $V_D = 0.7$ volt, it may be seen that for these circuit constraints an optimum value for B is $B = 0.435$.

The same equations above also apply to voltage $V_y$ across the collector of transistor T2. FIG. 3 also illustrates Strobe inputs applied to the cathodes of diodes D3 and D4. Either or both of the outputs of the differential amplifier may then be controlled by the Strobes.

Figure 4:
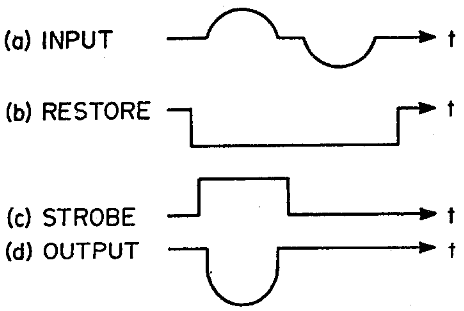
FIG. 4 is a graph illustrating the variance of the output voltage of the circuit of FIG. 3 upon variance of the biasing resistance.

Referring to FIG. 4, the variations of the voltage at $V_x$ versus variation in the parameter B as determined by Equation (17) is plotted. It will be seen that substantial amounts of variation of the voltage $V_x$ may be obtained by variation of the resistor ratio B. The variation of the voltage at $V_x$ determines the range of input trigger voltages of the circuit.

Figure 5:
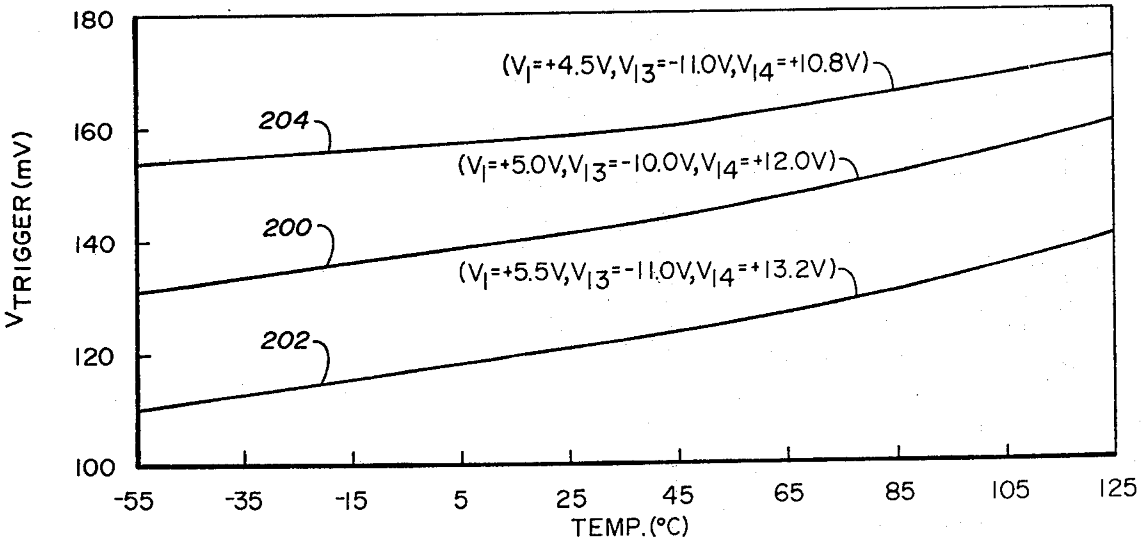
FIG. 5 is a graph of the variance of the trigger voltage of the invention with temperature.

The variation of DC trigger voltage versus temperature for various power supply values is illustrated in FIG. 5. Curve 200 illustrates that little variation occurs in the voltage trigger of the present circuit over a temperature range of 180°C. Curve 200 utilizes nominal preferred DC voltage biases. Curve 202 illustrates changes in triggering voltage with the utilization of slightly higher bias voltages. Curve 204 illustrates variation of triggering voltage by temperature with the use of slightly lower biasing voltages than those used for curve 200.

Figure 6:
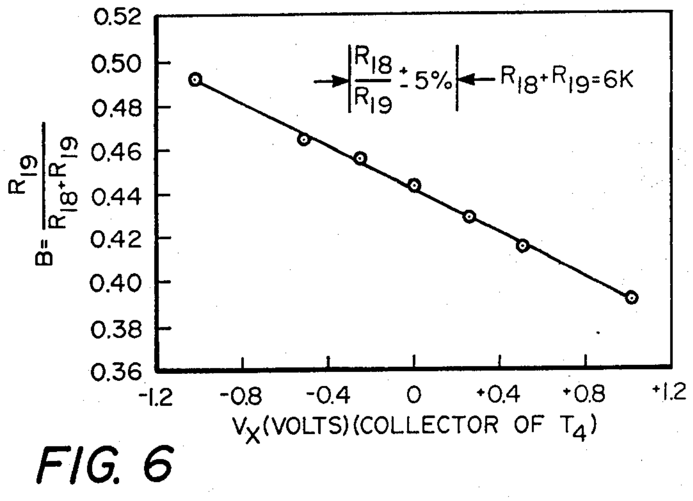

Referring to FIG. 6, an example of the operation of the Restore and Strobe gates of the invention is illustrated. The input wave form shown in FIG. **6*a* is diagrammatically representative of the signal output from an amplified plated wire memory. Generally, this voltage is sensed by a switched preamplifier circuit such as the one disclosed in applicants' copending patent application Ser. No. 888,393, filed Dec. 29, 1969. The preamplified voltage is then fed into the input terminals 12*a–b* of the present invention. A Restore gate signal shown in FIG. 6*b* is applied at terminal 18 so that only the desired input signal is fed to the present amplifier system. This gating operation tends to eliminate noise problems present with the low level signals from plated wire memories. It is generally desirable only to amplify the positive portion of the plated wire memory, and thus the Strobe waveform 6*c* is applied at terminal 22 in order to apply to the output terminals 24*a–b* the amplified output shown in 6*d*.** With use of the present amplification circuitry, low level signals may be amplified to the level of three to four volts.

Referring to FIG. 2, the operation of the Restore Gates will be described in more detail. If a ground or zero voltage is applied at terminal 18, both transistors 156 and 166 are turned off and the input signals applied to **12*b* go through to the amplifier. If a high or logic one signal is applied to terminal 18, transistors 156 and 166 are turned on and the input signal applied to terminal 12*b* is clamped to ground. Similarly, if a high input is applied at terminal 18, transistors 134 and 144 are turned on and the input applied to input terminal 12*a*** is clamped to ground.

The operation of the Strobe gate may also be understood by reference to FIG. 2. If the voltage applied to the base of transistor 58 is $2V_B$ or below, then transistor 70 is turned off and the output is applied from transistor 60 and through the diode connected transistor 62 to terminal **24*a*. If the voltage applied to the base of transistor 58 is above $2V_B$, transistor 58 is turned on and provides base current to turn the transistor 70 on. The output of the circuit then goes to near circuit ground or zero. Thus, the operation of the Strobe gate is controlled with respect to the base voltage input applied to transistor 58. If the voltage applied at terminal 22 is at or near ground or zero, the voltage at the collector of transistor 40 is maintained at or above one $V_{BE}$. Thus, it takes at least $3V_{BE}$ to turn transistor 70 on and the Strobe gate is normally turned off. If a relatively high input signal is applied to the Strobe terminal 22, a high voltage is applied to transistor 58 to enable transistor 70 to be turned on, allowing the output voltage to appear at terminal 24*a*.**

Another important aspect of the invention is that the amplifier is generally insensitive to the presence of radiation fields. It is well known that when gamma radiation impinges upon a reverse biased semiconductor junction, that additional leakage current is generated. This additional current presents problems in amplification circuits used in the presence of high radiation fields, as the transistors tend to become saturated and amplification can no longer take place.

The present invention thus utilizes compensating diodes disposed throughout in order to generate compensating current upon the presence of radiation fields in order to reduce the effect of the current generated by the active amplifying elements. For instance, transistors 52 and 54 tend to compensate the Darlington circuit comprised of transistors 94 and 96 for the effect of an ambient radiation field. Likewise, transistors 66 and 68 provide radiation compensation for the buffer output stage of the circuit. Additional diode connected transistors disposed throughout the circuit provide a relatively linear operation even in the presence of high radiation fields.

To better illustrate the compensation effect provided by the diodes, reference is made to FIG. 7, wherein variation in the output voltage of the circuit versus the application of increasing radiation fields is plotted. It may be seen that a generally linear operation of the circuit exists up to the application of a relatively heavy radiation field. Without the compensating circuitry of the invention, a marked change in the output voltage of the circuit would occur with the application of a much lower radiation field.

FIG. 8 illustrates a block diagram of a variation of the circuit shown in FIG. 3, wherein a pair of inputs and a pair of outputs are each selectable with Restore and Strobe signals. The constant positive voltage supply 210 supplies a constant bias voltage to each side of a differential amplifier stage 212. The voltage supply 210 may, for instance, be similar to that shown in FIG. 2 which comprises transistors 80, 88, 90 and 92. The differential amplifier 212 may, for instance, comprise a conventional two transistor circuit connected in a similar manner as transistors 34 and 40 as shown in FIG. 2. In this circuit, however, input signals are applied direct to the base of each of the transistors as schematically illustrated by the two arrow inputs. Additionally, in this embodiment outputs are taken from the collectors of each of the transistors instead of the single output as shown in FIG. 2.

A constant source of negative bias voltage is applied by a supply 214 to each side of the differential amplifier 212. The constant negative voltage supply may, for instance, comprise a similar source as that shown in FIG. 2 which includes transistors 106, 112, 116 and 118. Additionally, constant current sources 216*a–b* are provided to supply generally constant current to each side of the differential amplifier. These constant current sources may comprise the modified Darlington circuit shown in FIG. 2 including transistors 94 and 96. Restore and Strobe inputs may be applied to selected sides of the differential amplifier 212 to enable selection of either or both of the input and output signals therefrom. These Restore and Strobe signals act upon circuits similar to the circuits described with respect to FIGS. 2 and 3.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A buffer amplifier system comprising:

a. first and second input terminals for receiving a small amplitude differential input signal;

b. differential transistor amplifier means connected to said input terminals to receive said differential input signal;

c. temperature compensated and regulated positive power supply means connected to said amplifier means;

d. a transistor current source operably connected to said amplifier means and biased to provide substantially constant current to said amplifier means;

e. a temperature compensated and regulated negative power supply connected to said current source and providing a substantially constant bias thereto;

f. transistor gating means connected between each of said input terminals and ground and clamping said differential input signal to ground said transistor gating means effective, responsive to application of a restore signal thereto, to isolate the associated input terminal from ground to enable application of said differential input signal to said differential amplifier means; and, g. a plurality of transistor structures respectively connected in a diode configuration comprising the collector-base junctions thereof, each of said differential amplifier means, current source and gating means having associated therewith and operably connected thereto at least one of said diode configured transistor structures, the reverse biased collector-base junction of which is effective to generate, responsive to neutron radiation, photocurrents of a magnitude and polarity to compensate photocurrents generated responsive to said neutron radiation by reverse biased collector-base junctions of the transistors in said differential amplifier means, current source and gating means.

2. A buffer amplifier system as defined in claim 1 wherein regulation of said positive and said negative power supplies is provided by a plurality of series-connected diode means connected across the terminals of said power supply, at least one of said diode means being reversed biased.

3. A buffer amplifier system as defined in claim 1 wherein said current source is a Darlington pair transistor configuration modified in that a resistance is connected between the emitter terminals of said pair.

4. A buffer amplifier system as defined in claim 1 further comprising a strobe-activated output terminal providing logic level output signals from one side of said differential amplifier means.

5. A buffer amplifier system as defined in claim 4 further comprising a second strobe-activated output terminal providing complementary logic level output signals from the other side of said differential amplifier means.

6. A buffer amplifier system comprising:

a. first and second input terminals for receiving a small amplitude and differential input signal;

b. differential transistor amplifier means connected to said input terminals to receive said differential input signal;

c. temperature compensated and regulated positive power supply means connected to said amplifier means;

d. a transistor current source operably connected to said amplifier means and biased to provide substantially constant current to said amplifier;

e. a temperature compensated and regulated negative power supply connected to said current source and providing a substantially constant bias thereto;

f. transistor gating means connected between each of said input terminals and ground and clamping said differential input signals to ground, said transistor gating means effective, responsive to application of a restore signal thereto, to isolate the associated input terminal from ground to enable application of said differential input signal to said differential amplifier means;

g. a plurality of transistor structures respectively connected in a diode configuration comprising the collector-base junctions thereof, each of said differential amplifier means, current source and gating means having associated therewith and operably connected thereto at least one of said diode configurated transistor structures, the reverse biased collector base junction of which is effective to generate, responsive to neutron radiation, photocurrents of a magnitude and polarity to compensate photocurrents generated responsive to said neutron radiation by reverse biased collector-base junctions of the transistors in said differential amplifier means, current source and gating means;

h. the regulation of said positive and negative power supplies being provided by a plurality of series-connected diode means, at least one of which is reverse biased; and, i. said current source comprising a Darlington pair transistor configuration modified in that a resistance is connected between the emitter terminals of said pair.

7. A buffer amplifier system as defined in claim 6 and further comprising a strobe-activated output terminal providing logic level output signal from one side of said differential amplifier means.

8. A buffer amplifier system as defined in claim 7 and further comprising a second strobe-activated output terminal providing a complementary logic level output signal from the other side of said differential amplifier means.

* * * * *